United States Patent [19]

Fouche et al.

[11] Patent Number: 4,864,221
[45] Date of Patent: Sep. 5, 1989

[54] FILTER, PHASE-MEASURING DEVICE AND METHOD FOR APPLICATION OF SAID FILTER

[75] Inventors: Yvon Fouche, Chatenay Malabry; Philippe Elleaume, Antony; Serge Drabowitch, Chatenay Malabry, all of France

[73] Assignee: Thomson-CSF, Paris, France

[21] Appl. No.: 214,721

[22] PCT Filed: Oct. 6, 1987

[86] PCT No.: PCT/FR87/00383

§ 371 Date: May 31, 1988

§ 102(e) Date: May 31, 1988

[87] PCT Pub. No.: WO88/02867

PCT Pub. Date: Apr. 21, 1988

[30] Foreign Application Priority Data

Oct. 7, 1986 [FR] France ................. 86 13938

[51] Int. Cl.⁴ ......................................... G01R 25/00
[52] U.S. Cl. .................................. 324/83 R; 324/78 F
[58] Field of Search ................... 364/724.19; 379/410; 358/167; 324/77 R, 77 B, 78 F, 78 E, 77 E, 77 H, 83 R, 83 A

[56] References Cited

U.S. PATENT DOCUMENTS 4,243,935 1/1981 McCool et al. ................... 324/78 F
4,695,843 9/1987 Lamiraux ............................ 342/417

FOREIGN PATENT DOCUMENTS 0128804 of 1984 European Pat. Off. .

OTHER PUBLICATIONS

G. Uohlbacher et al.; "Bauelement e mit . . . ", Nachrichteu Elektronik, vol. 32, #6, Jun. 1978, pp. 181–187, see p. 186, para 4.1.
List (2 pages) of U.S. Applications/Patents of Applicants—(Applicants Attorney does not have copies in the file).

Primary Examiner—Michael J. Tokar
Attorney, Agent, or Firm—Roland Plottel

[57] ABSTRACT

The present invention concerns mainly a filter, a phase-measuring device and a method to apply said filter. The main object of the invention is a phase-measuring device. The use of adapted filters (140) enables the increasing of the signal/noise ratio of a received signal. However, if several samples of the signal are sent, each having a different phase, the signal present at the output of the adapted filter at any given instant risks being a mixture of the phase of two successive samples. The use of an odd value filter (141) makes it possible to determine the only instants during which the phase measurement corresponds to the phase of a single sample of the signal. The invention can be applied chiefly to the demodulation, detection or decoding of television and radio broadcasts or phase-modulated data transmissions.

11 Claims, 5 Drawing Sheets

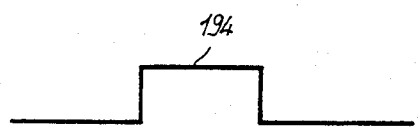
FIG_1
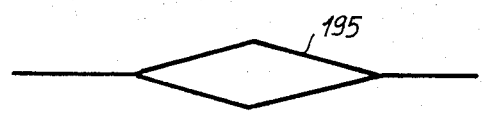
FIG_2
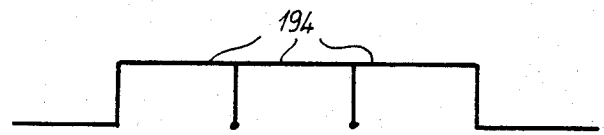
FIG_3
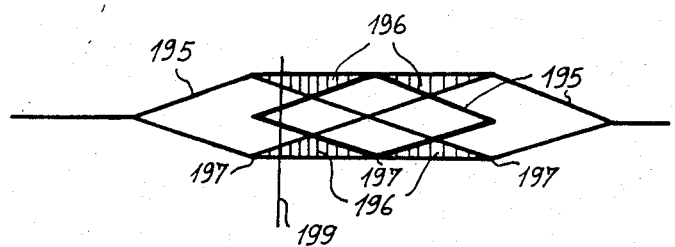
FIG_4
FIG_5
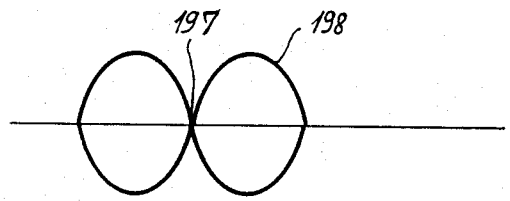
FIG_6

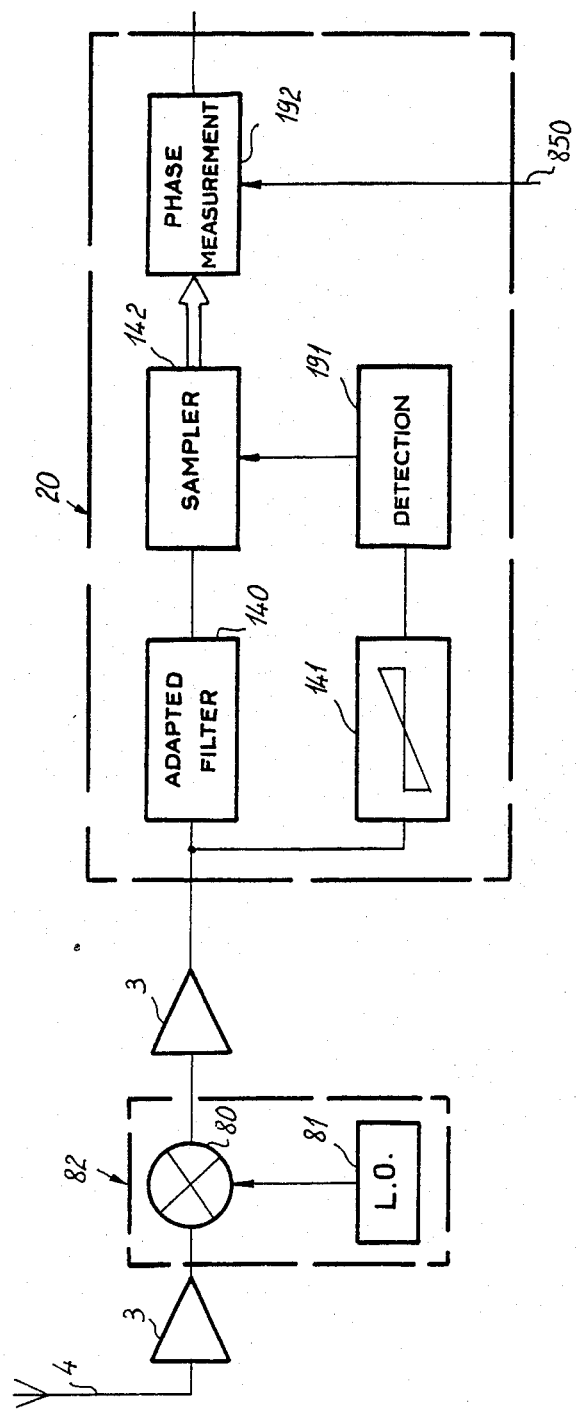
FIG_7

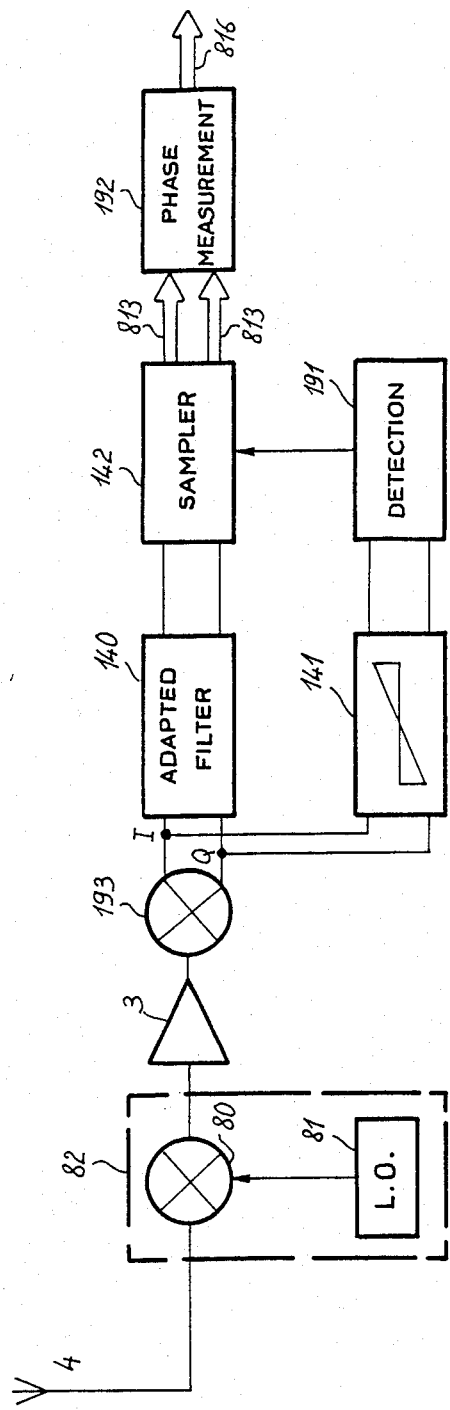
FIG_8

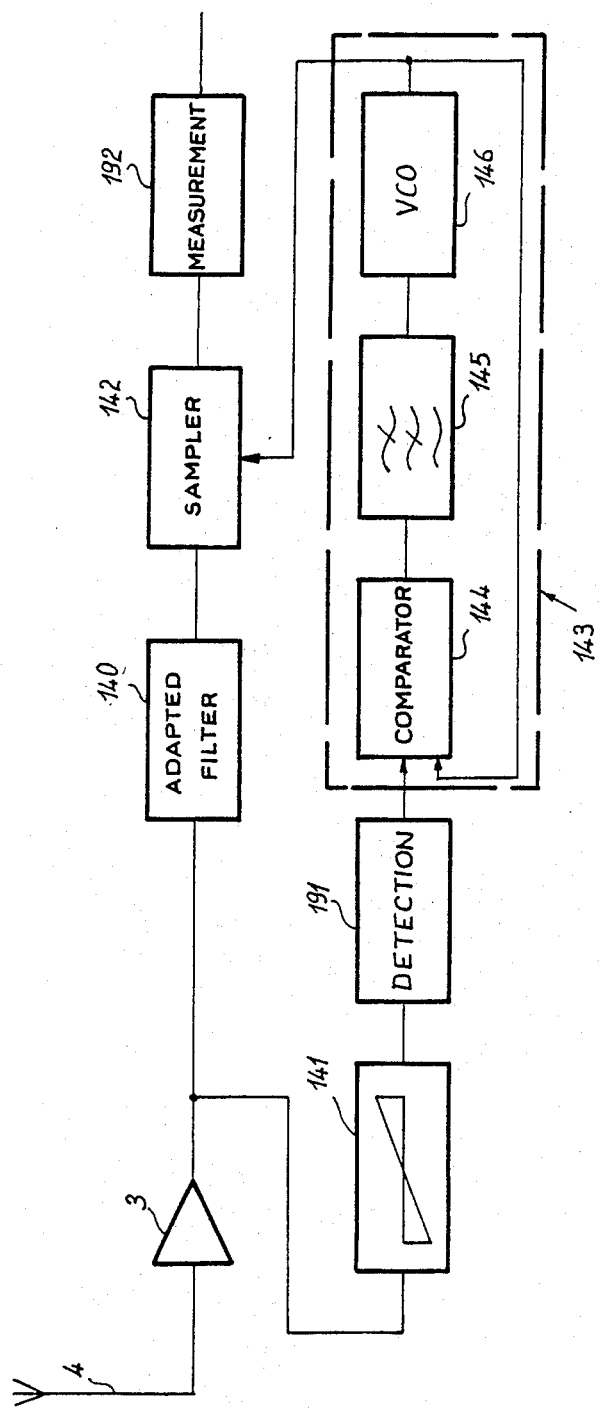

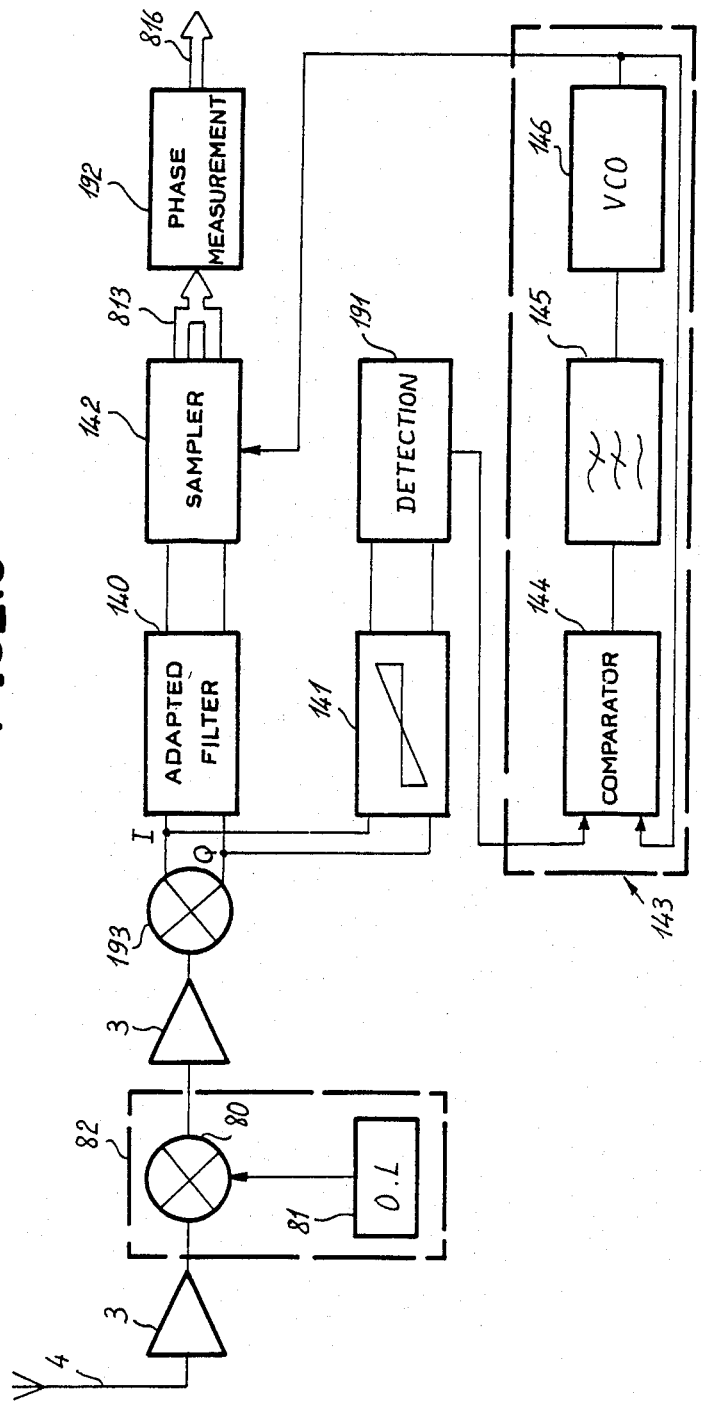
FIG_10

FILTER, PHASE-MEASURING DEVICE AND METHOD FOR APPLICATION OF SAID FILTER

FIELD OF THE INVENTION

The present invention relates to a filter, a phase-measuring device and a method to apply the said filter.

To make measurements on a radioelectric signal, it is advantageous to put the said signal through a filter adapted to increase its amplitude. However, if the quantity to be measured varies with time, there is a risk that the measurement will take two successive values of the said quantity into account. Thus, it is essential to make the measurement at the instant when the signal at the output of the adapted filter is affected only by a single value of the quantity to be measured.

The device according to the present invention can be used, in particular, to make phase measurements of a continuous signal.

SUMMARY OF THE INVENTION

The main object of the present invention is a signal-processing filter characterized in that it has an odd value transfer function, the transfer function of the said filter being symmetrical in amplitude and anti-symmetrical in phase, with respect to the center frequency of the said filter.

Another object of the present invention is a method for measuring the phase of a signal comprising several samples, characterized in that the phase measuring and/or signal sampling instant is determined by detecting the passage through 0 of the signal that has crossed a filter, the transfer function of which is anti-symmetrical in phase and symmetrical in amplitude with respect to the center frequency of the said filter.

BRIEF DESCRIPTION OF THE DRAWINGS

The present invention will be better understood from the following description and the appended drawings, given as non-restrictive examples, of which:

FIG. 1 is a diagram showing the envelope of a signal;

FIG. 2 is a diagram illustrating the envelope of the signal of FIG. 1 after it has gone through an adapted filter;

FIG. 3 is a diagram illustrating the envelope of a signal;

FIG. 4 is a diagram illustrating the limits of variation of the signal of FIG. 3 after it has gone through the adapted filter;

FIG. 5 is an example of the envelope of the signal of FIG. 3 after it has gone through an adapted filter;

FIG. 6 is a diagram showing the phase of a signal after it has gone through an odd value filter;

FIG. 7 is a diagram of a first alternative embodiment of the device according to the invention;

FIG. 8 is a diagram of a second alternative embodiment of the device according to the invention;

FIG. 9 is a diagram of a third alternative embodiment of the device according to the invention;

FIG. 10 is a diagram of a fourth alternative embodiment of the device according to the invention.

In FIGS. 1 to 10, the same references are used to designate the same elements.

For clarity's sake, the carriers are not shown in FIGS. 1 to 6.

DESCRIPTION OF PREFERRED EMBODIMENTS

FIG. 1 shows the envelope of a square signal 194. In the example shown, the signal 194 is a coherent signal with constant amplitude and phase.

FIG. 2 shows the envelope 195 of the signal 194 of FIG. 1 after it has gone through an adapted filter. The phase of the signal at the output of the adapted filter is the same as that of the signal 194. Thus, if it is desired to measure this phase, the measurement can be done at any moment. Advantageously the phase is measured when the amplitude of the signal at the output of the adapted filter is at its maximum.

FIG. 3 shows a timing diagram comprising three successive signals 194. The signal is, for example, a coherent signal of constant amplitude. Each sample 194 of the signal has its own phase taking, for example, data transmissions in phase modulation.

FIG. 4 shows the value that can be assumed by the value of the signal of FIG. 3 that has gone through a filter adapted to a sample 194 of the signal. The three diamonds 195 correspond to the signal that could be obtained by making each sample 194 of the signal go individually through the adapted filter. The total envelope of the signal begins with half of the first diamond 195, then includes a lined triangle 196, passes through the point 197, the value of which corresponds to that of the diamonds 195, another lined triangle 196 and ends with half of the last diamond 195. If the signal present at the output of the adapted filter is measured without taking any special precautions, there is the risk of measuring the value of the sum of the phase of two successive samples 195 of the signal. For example, if the phase is measured at the instant corresponding to the reference 199 in FIG. 4, a phase will be measured that corresponds to $$\frac{3\phi_1 + \phi_2}{4},$$

$\psi_1$ being the phase of the first sample 194 of the signal, and $\psi_2$ being the phase of the second sample 194 of the signal.

FIG. 5 shows an example of an envelope of a signal that has crossed a filter adapted to the sample of the signal. As can be seen in FIGS. 4 and 5, a phase measurement made at the time corresponding to the point 197 can be used to measure the pure phase corresponding to a single sample of the signal 194.

FIG. 6 shows the envelope of the signal 198 that has crossed an odd value filter. It can be seen that the signal is cancelled at the point 197.

The present invention uses this phenomenon to determine the point 197 by which it is possible to measure the phase corresponding to a single sample 194 of the signal. The odd value filter is, for example, a surface acoustic wave (SAW) filter or a digital filter.

An odd value or asymmetrical filter is a filter for which the transfer function is odd-numbered for the phase, with respect to the center frequency of the filter, and symmetrical for the amplitude, with respect to the center frequency of said filter.

FIG. 7 shows a device 20 that enables the successive measurement of the phase of various signal samples.

The device 20 comprises an adapted filter 140, a digital sampler 142 and a phase measuring device 192, connected in series. An odd value filter 141 is connected to the input of the adapted filter 140. The output of the odd value filter 141 is connected to the input of a phase detection device 191. The phase detection device 191 controls the sampling device 142. The detection device 191 is, for example, a Schmit trigger.

The phase measuring device 192 is, for example, a phase comparator that compares the phase of the received signal with a reference phase received by a line 850.

In an alternative analog embodiment of the device according to the invention, the adapted filters 140 and the odd value filters 141 are made, for example, in the form of a surface acoustic wave device.

In a second embodiment of the device according to the invention, the adapted filters 140 and the odd value filters 141 are digital filters.

In the example shown in FIG. 7, the device according to the invention is connected to a device for the reception of phase modulated waves. The phase modulated waves transmit, for example, television broadcasts, radio broadcasts, control instructions or alphanumeric data. In an example shown in FIG. 7, the receiving device has the following series-connected elements: a receiving antenna 4, a microwave amplifier 3, a frequency reduction device 82 and an intermediate frequency amplifier 3. The frequency reduction device 82 comprises, for example, a duplexer 80 connected. Firstly, to the microwave amplifier 3 and, secondly, to a local oscillator 81.

In a simplified alternative embodiment of the device according to the invention, the detection device 191 directly controls the phase measuring device 192.

When the signal that has gone through the odd value filter 141 passes through 0, the detection device sends a control signal enabling the signal to be sampled. The passage of the signal through 0 corresponds to the point 197 of FIG. 6 and, hence, to the point 197 of FIGS. 4 and 5. When making the device 20 according to the invention, it is carefully seen to it that the delays induced in the branch comprising the adapted filter 140 and the sampler 142 are compensated for by the delay induced in the branch comprising the odd value filter 141 and the detection device 191.

FIG. 8 shows an example of an embodiment of the device according to the invention providing for the separation of the real and imaginary parts of the signal, namely the part in phase and the part in phase quadrature, and for the performance of separate processing operations on both parts of the signal until the phase is measured.

The separation of the signal into its real and imaginary parts simplifies the phase measurement. For the value of the real part is proportionate to the cosine of the phase, while the value of the imaginary part is proportionate to the sine. Thus, from a comparison of the real part and the imaginary part, the phase of a signal may be deduced in a simple manner.

Should the required precision, namely the necessary number of address bits, allow it, the conversion of the values of the real and imaginary parts of the phase signal is tabulated. In this case, the phase measuring device 192 is a permanent memory. The values I and Q of the signal are connected to the address bus 813 and the value of the phase is collected at the data bus 816. For large-scale production, a read-only memory (ROM) will be advantageously used. For production on a smaller scale, PROMs, EPROMs and EEPROMs will be used. Inasmuch as it is sought to retain the possibility of modifying the data of the table contained in the memory, it is possible to use RAMs. The values of the table are stored whenever required, from a magnetic disk for example.

FIG. 9 shows an alternative embodiment of a device of the invention comprising a phase locked loop (PLL). The phase locked device 143 is connected between the detection device 191 and the sampler 142. The phase locking device comprises, for example, the following elements connected in series: a phase comparator 144, a low-pass filter 145 and a voltage controlled oscillator 146. The output of the voltage controlled oscillator 146 is connected, firstly, to the sampling device 142 and, secondly, to a second input of the comparator 144.

FIG. 10 shows an example of an embodiment of the device according to the invention associating the principle of separating the signal into real and imaginary parts and with the use of a phase-locked circuit 143. The device according to the invention comprises the following connected in series: a reception antenna 4, a microwave amplifier 3, a frequency reduction device 82, an intermediate frequency amplifier 3, a device 193 to separate the real and imaginary components of the signal, an adapted filter 140, a sampler 142, an address bus 813, a phase measuring device 192 and a data bus 816. Furthermore, at the output of the device 193 for separating the real and imaginary parts of the signal, there are the following series-connected elements: an odd value filter 141, a detection device 191 and a phase-locked device 143. The phase-locked device 143 has, for example, a comparator 144 connected to a low-pass filter 145 and a voltage controlled oscillator 146.

The adapted filter 140, the odd value filters 141, the sampler 142 and the detection device 191 simultaneously process the imaginary and real parts of the signal. The detection device 191 is connected to a first input of the comparator 144. The output of the voltage controlled oscillator 146 is connected, firstly, to the control device of the sampler 147 and, secondly, to a second input of the comparator 144.

The present invention can be applied mainly to phase detection, demodulation and decoding.

The present invention can be applied especially to the reception of television broadcasts, radio broadcasts or data transmission in phase modulation or in phase and amplitude modulation. The present invention can also be applied to radars.

What is claimed is:

1. A device for measuring the phase of a phase modulated signal comprising,
    an input for receiving a phase modulated input signal,
    an adapted filter (140) connected to receive said input signal,
    an odd value filter (141), having a transfer function which is symmetrical in amplitude and anti-symmetrical in phase with respect to a center frequency of said filter connected to receive said input signal,
    and a phase measuring circuit (191, 142, 192) connected to receive outputs from said two filters and for measuring the phase of the signal at the output of said adapted filter.

2. A device according to claim 1 wherein said phase measuring circuit comprises, connected to the output of the anti-symmetrical transfer function filter (141), a zero crossing detector (191).

3. A device according to claim 2 characterized by the fact that the zero crossing detector (191) is a Schmit trigger.

4. A device according to claim 2 wherein said phase measuring circuit comprises a sampler (142) connected to the adapted filter for sampling the signal from the adapted filter, and said sampler being connected to and controlled by the zero crossing detector (191).

5. A device according to claim 4 further comprising a phase locked device (143) between said detector (191) and said sampler (142).

6. A device according to any one of the claims 1, 2, 4, or 5 further comprising a device (193) capable of separating the real and imaginary parts of the phase modulated input signal, connected between an input to receive said phase modulated input signal (from 3) and said inputs of said, the adapted filter (140), and the phase asymmetrical transfer function filter (141); the sampler (142) and the zero crossing detector (191) processing the real and imaginary parts of the phase modulated input signal.

7. A device according to claim 6 further comprising a phase measurement device (192) connected to an output of said sampler for comparing the value of the real part of the signal with the value of the imaginary part of the signal.

8. A device according to claim 7 wherein the phase measurement device (192) comprises a permanent memory, and wherein values of the real and imaginary parts of the signal being applied to an address bus (813), the corresponding phase value, stored in said memory, being applied on a data bus (816).

9. A device according to claim 8 further comprising a frequency reduction device (82) capable of reducing the frequency of the phase modulated input signal before it is received by said filters (140, 141).

10. A method of measuring the phase of a signal comprising, the steps of adapted filtering said signal,
odd-value transfer function filtering said signal,
sampling said adapted filtered signal, and then phase measuring said signal samples, wherein,
said signal sampling and phase measuring a determined by detecting the passage through a reference of the signal that has been odd-value transfer function filtered,
and said odd value transfer function filtering is antisymmetrical in phase and symmetrical in amplitude with respect to the center frequency of said filtering.

11. A circuit for receiving a phase modulated input signal and measuring the phases of said signal comprising,
an adapted filter for receiving said signal and filtering said signal to an output, said filtered output signal having an optimum phase and amplitude to be measured at an optimum delay of said input signal,
an odd-value transfer function filter for receiving said input signal and providing an output signal proportional to said optimum delay, and
a sampler connected to said filters for receiving said output signals therefrom and for sampling said filtered output signal at said optimum delay in accordance with received signal from said odd-value filter.

* * * * *